United States Patent [19]

Dennhardt

[11] 4,375,285
[45] Mar. 1, 1983

[54] DEVICE FOR TRANSPORTING AND POSITIONING PRINTING PLATES

[75] Inventor: Werner Dennhardt, Taunusstein, Fed. Rep. of Germany

[73] Assignee: Hoechst Aktiengesellschaft, Frankfurt am Main, Fed. Rep. of Germany

[21] Appl. No.: 278,846

[22] Filed: Jun. 29, 1981

[30] Foreign Application Priority Data

Jul. 3, 1980 [DE] Fed. Rep. of Germany ....... 3025201

[51] Int. Cl.³ .......................... B65H 1/02; B65H 3/08
[52] U.S. Cl. ...................................... 271/11; 101/419; 271/15; 271/21; 271/30 A; 271/98; 271/225; 271/162
[58] Field of Search ....................... 271/10, 11, 12, 13, 271/14, 15, 20, 21, 22, 97, 98, 162, 184, 185, 225, 267, 30 A, 23; 414/330, 116; 355/14 SH, 73, 76; 101/419, 420, 232, 141, 142, 143, 144

[56] References Cited

U.S. PATENT DOCUMENTS

| | | | |
|---|---|---|---|
| 2,817,518 | 12/1957 | Anness | 271/23 |
| 3,499,645 | 3/1970 | Kojinoda et al. | 271/162 |
| 3,578,312 | 5/1971 | Kocourek | 271/20 |
| 3,953,020 | 4/1976 | Ruf et al. | 271/267 |
| 4,002,332 | 1/1977 | Hoenigmann | 271/11 |
| 4,006,984 | 2/1977 | Friese | 355/11 |
| 4,149,798 | 4/1979 | McGowan et al. | 355/8 |

*Primary Examiner*—Bruce H. Stoner, Jr.
*Assistant Examiner*—Donald Hajec
*Attorney, Agent, or Firm*—Schwartz, Jeffery, Schwaab, Mack, Blumenthal & Koch

[57] ABSTRACT

Disclosed is a device for transporting printing plates, having one coated and one uncoated surface, stacked in a holder to an exposure and developing station and for positioning them, comprising a holder for holding a plurality of printing plates stacked in alternating relationship with a plurality of separating sheets and a device for selectively positioning the holder substantially perpendicularly to the direction of transport of the printing plates so that the uncoated surface of each printing plate faces toward the direction of transport. A suction device engages the uncoated side of the first printing plate from the stack in the holder, and a device, movable horizontally in the direction of transport, is provided for transporting the suction device between a first position adjacent to the holder and a second position displaced from the first position in the direction of transport, to withdraw the engaged printing plate from the stack. A selectively engageable gripping device for the lower edge of the withdrawn printing plate is positioned beneath the second position of the transporting means. At least one nozzle is positioned adjacent to the holder and is pointing generally in the direction of transport for directing compressed air against the coated surface of the withdrawn printing plate. Furthermore, a device is positioned above the gripping device, for laterally positioning a printing plate located in the second position of the transporting device.

12 Claims, 1 Drawing Figure

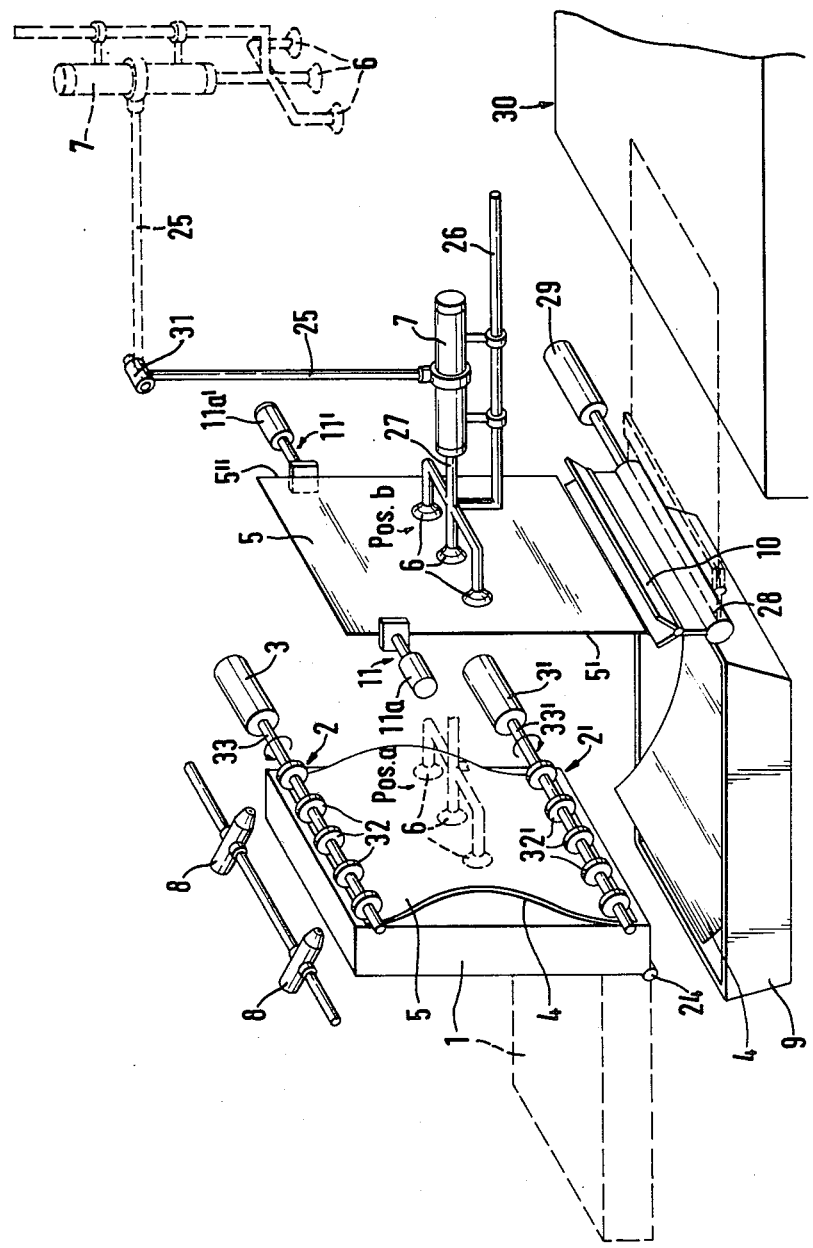

DEVICE FOR TRANSPORTING AND POSITIONING PRINTING PLATES

BACKGROUND OF THE INVENTION

The present invention relates to a device for transporting printing plates stacked in a holder to an exposure and developing station, and for positioning them therein.

Imaged printing plates which can be readily used for printing are prepared by first charging the printing plates electrostatically and then projecting the image of an original onto the individual printing plates. After termination of this exposure step, the printing plate is developed by using a developer, fixed and decoated, whereupon it is ready for use in printing.

From U.S. Pat. No. 4,006,984 an apparatus for the manufacture of printing forms by electrophotographic means is known. In this apparatus, the individual printing forms are removed from a stack in a supply magazine by a transport device which comprises a carriage having a vacuum suction device and which conveys the printing forms to an exposure platform. A corona charging station for the electrostatic charging of the printing plates is installed at the front side of the carriage and extends perpendicularly to the direction of movement of the carriage in order to combine the charging of the individual printing forms with their transport to the exposure platform and thus to save time. The carriage runs on two guide rails and is driven by a motor installed on its upper side, through a gear and a rack-pinion gear arranged in parallel to the direction of movement of the carriage. The carriage has a vacuum plate attached to its underside which is connected by a number of openings with a vacuum pump. When the carriage touches the upper surface of the uppermost printing plate in the plate holder, a reduced pressure is created by which this uppermost printing plate is drawn to the vacuum plate. Then the carriage is moved in the direction of the exposure platform by means of the motor. As soon as it has reached its position above the exposure platform, the carriage is lowered onto the platform and the reduced pressure created in the vacuum plate is interrupted, so that the printing plate is released and deposited on the exposure platform. The latter is also constructed as a vacuum plate, and a reduced pressure is applied to it, so that the printing plate is firmly urged against the exposure platform.

In this known apparatus, the printing plates are stacked in the plate holder with their photoconductive layers pointing in the upward direction, and their coated surfaces are drawn to the vacuum plate of the carriage. When a new stack is inserted into the plate holder or when the apparatus is opened, the incident light may lead to a pre-exposure of those plates which are still in the holder, whereby the printing quality of the readily developed plates may be adversely affected. When the individual printing plates are lifted off the stack, the photoconductive surfaces of the printing plates are touched by the suction devices. It is true that, compared with rollers or conveyor belts which are installed in other known apparatus, a more careful transport of the printing plates is made possible by these suction devices, but nevertheless the formation of mechanical or physical voids on the developed printing plates cannot be completely avoided.

U.S. Pat. No. 4,149,798 discloses a transport station for printing plates which comprises a stacking area where a supply of printing plates is stored. The individual printing plates are separated from one another by sheets of paper for which a disposal area is provided. By means of a control mechanism which is provided with a number of suction cups, the printing plates are transported from the stacking area to a conveyor belt. The control mechanism is pivotally fastened to a guide arm which, via a gear, is connected to a motor, in order to be able to carry out a lateral back-and-forth sliding movement. The uppermost printing plate is engaged by at least four suction cups. Then the control mechanism swings in the upward direction, and simultaneously the guide arm is mechanically moved in the direction of the conveyor belt. Upon release of the vacuum in the suction cups, the control mechanism moves downwardly, and the printing plate is deposited on the conveyor belt. A second control mechanism above the interposed sheet of paper then picks up the sheet and conveys it to the paper disposal bin.

By means of the conveyor belt, the printing plate is transported to an exposure platform. The surface of the exposure platform is provided with a number of holes and forms a chamber which, via a suction line, is connected with a vacuum plate. When the printing plate has been brought into proper alignment on the surface of the exposure platform, it is retained on the latter by creating a vacuum. The printing form is exposed by means of an exposure system comprising a movable carriage platform on which a corona-charging device and a light-reflecting mirror are arranged. A laser for reflecting modulated laser light is installed such that the light beam emitted by the laser is deflected by the mirror and strikes the printing plate on the exposure platform in a plane extending substantially perpendicularly to the surface of the printing plate.

In this known apparatus an accurate positioning of the individual printing plates can be carried out neither in their transverse nor in their longitudinal direction prior to conveying them to the exposure platform and to the other treatment stations, since no means are provided for this purpose. The removal of the separating sheets of paper between the individual printing plates prior to transport to the exposure station requires additional time.

SUMMARY OF THE INVENTION

It is therefore an object of the present invention to provide an improved device for transporting and positioning printing plates.

It is a further object of the invention to provide a device for transporting and positioning printing plates, by means of which the time required for some of the individual treatment steps can be reduced.

It is also an object of the invention to provide such a device whereby the removal of paper layers between the printing plates stacked in the holder can be carried out easily and in a time-saving manner.

Another object of the invention resides in providing such a device which makes possible accurate positioning of the printing plates both in the transverse and in the longitudinal direction.

In accomplishing the foregoing objects, there has been provided in accordance with the present invention a device for transporting printing plates, having one coated and one uncoated surface, stacked in a holder to an exposure and developing station and for positioning them, comprising a holder for holding a plurality of printing plates stacked in alternating relationship with a plurality of separating sheets, including means for selectively positioning the holder substantially perpendicularly to the direction of transport of the printing plates so that the uncoated surface of each printing plate faces toward the direction of transport; a suction device for engaging the uncoated side of the first printing plate from the stack in the holder; means, movable horizontally, in the direction of transport, for transporting the suction device between a first position adjacent the holder and a second position displaced from the first position in the direction of transport, to withdraw the engaged printing plate from the stack; a selectively engageable gripping device for the lower edge of the withdrawn printing plate, wherein the gripping device is positioned beneath the second position of the transporting means; at least one nozzle positioned adjacent to the holder and pointing generally in the direction of transport for directing compressed air against the coated surface of the withdrawn printing plate; and means, positioned above the gripping device, for laterally positioning a printing plate located in the second position of the transporting means. Preferably, the holder includes means for pivoting it into a horizontal position, so that the printing plates can be stacked in the holder with their coated surfaces facing downwardly. In a preferred embodiment, the device further comprises two horizontally aligned means for removing the first printing plate from the stack in the holder, wherein the removing means press against the uncoated surface of the first printing plate when the holder is in its vertical position. Preferably, each removing means comprises a plurality of rollers arranged on a common shaft and a motor for driving the shaft, and the lower shaft rotates in the opposite direction from the upper shaft of the other removing means.

Further objects, features and advantages of the present invention will become apparent from the detailed description of preferred embodiments which follows, when considered together with the attached figure of drawing.

BRIEF DESCRIPTION OF THE DRAWING

The FIGURE of drawing is a schematic perspective view of a device for transporting printing plates according to the present invention.

DETAILED DESCRIPTION OF PREFERRED EMBODIMENTS

According to the present invention, in a device of the type described above, the plate holder is installed perpendicularly to the direction of transport of the printing plates, and the uncoated surfaces of the printing plates point in the direction of transport. Suction elements, which are actuated by a movable lifting cylinder, take up the uppermost printing plate. During the take-up, compressed air from air nozzles is applied to the light-sensitive, paper-covered surface. The suction elements transport the plate to a gripping device which is open in the upward direction. Above the gripping device, positioning units are arranged opposite to one another, and the distance between these positioning units is adjustable. In a further embodiment of the invention, the plate holder can be pivoted about a hinged joint, so as to rest in a horizontal position, and the printing plates are stacked in the holder with their light-sensitive surfaces pointing downwardly. When the plate holder is rotated into the vertical position, the stack of plates is thereby pressed against two horizontally aligned removing devices by the holder. Each of these removing devices comprises a guide having a number of rollers arranged on a common shaft which is driven by a motor.

The advantages which are achieved by this invention are as follows. The printing plates are in a vertical position when they are being removed from the holder, whereby, compared with horizontal stacking, the removal of the paper layers from the coated surfaces of the printing plates by means of compressed air from nozzles is facilitated. An easy longitudinal adjustment of the printing plates is ensured by the V-shaped gripping device, the open part of which points in upward direction. The transverse positioning of the printing plates is made possible by the two positioning devices up to an accuracy of about $10^{-2}$ mm.

The invention shall now be explained in more detail by means of an exemplary embodiment illustrated in the FIGURE of drawing.

The FIGURE shows a schematic perspective view of the device for transporting and positioning printing plates 5 which are stored in a plate holder and from this holder are transported to an exposure and developing station 30. The device comprises a lifting cylinder 7 fastened to one end of a rod 25 which is pivotable at bearing 31 about a horizontal axis. Lifting cylinder 7 is maintained in its horizontal working position by a guide rod 26. On the cylinder rod 27, which can be moved inwardly and outwardly, suction elements 6 are arranged. The device further comprises a gripping device 10 and two positioning units 11, 11', which are arranged oppositely to one another. The distance between positioning units 11, 11' is variable, and they are installed vertically above the gripping device 10.

The holder 1 can be swung around a hinged joint 24 from the horizontal to the vertical position. For filling, the holder 1 is rotated to the horizontal position (shown in broken lines), and a stack of printing plates 5 is inserted with their light-sensitive surfaces pointing downwardly, so that the danger of a pre-exposure is excluded. Interposed sheets 4 are provided on the light-sensitive surfaces of the printing plates 5, wherein the material used for these sheets is paper, plastic film or the like. One sheet 4 is inserted between each two printing plates 5.

When the holder 1 is in its vertical position, the stack of printing plates is pressed against two resiliently arranged removing devices 2, 2', which are composed of one guide each, having a number of rollers 32, 32'. The rollers are arranged on a shaft 33, 33', which is driven by a motor 3, 3'. The rollers 32 on the upper shaft 33 rotate in a direction opposite to that of the rollers 32' on the lower shaft 33', so that after removal of a printing plate 5 from the holder 1 by means of the suction elements 6, the remaining sheet 4 is removed from the light-sensitive surface of the plate 5 in a downward direction by the rollers 32' which are in contact with the sheet 4 near its upper edge, and in an upward direction by the rollers 32' which contact the sheet 4 near its lower edge. By the counter-rotating movement of the rollers 32 and 32', the lifting off and the removal of the first printing plate 5 from the stack in the holder 1 is facilitated.

Air nozzles 8 aligned obliquely to the horizontal direction, i.e., to the direction of transport of the printing plates, are installed above the holder 1 (when the latter is in its vertical position). The compressed air ejected by the nozzles 8 removes, from the printing plate 5, the sheet 4 which protects the light-sensitive coating of the printing plate 5 from being damaged. The sheet 4, which usually will be a sheet of paper, is blown by the air flow into a receiving tray 9 below the transport path of the printing plates.

The angle at which the air nozzles 8 are mounted varies between about 15° and 45°, relative to the horizontal line.

The rod 25, to one end of which the lifting cylinder 7 is fastened, can be pivoted about a bearing 31. In the neutral position of the lifting cylinder 7, the rod 25 rests in a horizontal position which is shown in the drawing by broken lines. In the working position, the rod 25 is swung down vertically, so that the lifting cylinder 7 and the guide rod 26 are aligned horizontally. The unit formed by the rod 25, the lifting cylinder 7 and the guide rod 26 can be moved horizontally until the suction elements 6, which are linked with the movable cylinder rod 27 of the lifting cylinder 7, come into contact with the uncoated surface of the first printing plate 5 in the holder 1. In the drawing, this position "a" of the suction elements is shown in broken lines. In this position, reduced pressure is applied to the suction elements 6 for drawing and holding the printing plate 5, and part of the cylinder rod 27 is then withdrawn into the lifting cylinder 7. During this process, the mid-portion of the printing plate 5 which is held by the suction elements 6 bulges convexly, so that the upper and lower edges of the printing plate 5 pass under the rollers 32, 32' of the removing devices 2, 2' in a kind of snap movement of the printing plate 5. By the counter-rotating movement of the rollers 32, 32', the removal of the printing plate from the holder 1 is facilitated. During the transport of the printing plate 5 from position "a" to position "b", the sheet 4 is removed from the coated surface of the printing plate 5 by the air nozzles 8 and is blown into the receiving tray 9. When the printing plate 5 has reached position "b" above the V-shaped opening of the gripping device 10, the vacuum is released from the suction elements 6 by which the printing plate 5 is held, so that the printing plate slides down the suction elements 6 into the opening of the gripping device 10. The printing plate 5 is thereby pressed against the suction elements 6 by the air flow from the nozzles 8, so that the printing plate 5 cannot fall over backwards. Due to its own weight, the printing plate adjusts itself vertically in the gripping device 10.

For the horizontal or, respectively, transverse adjustment, there have been provided two positioning units 11, 11', each comprising a positioning plate and a motor 11a, 11a'. The two positioning units are constructed such that printing plates of all standard sizes and of all intermediate sizes can be electromechanically adjusted by them. The position of one of the positioning plates is digitally predetermined in a known manner, so that this plate then serves as a fixed stop for one of the edges 5' or, alternatively, 5" of the printing plate 5. When this one edge of the printing plate is in contact with the positioning plate, the second positioning plate is moved in the direction of the stop surface until it strikes the edge 5' or, alternatively 5" of the printing plate 5 which lies opposite the stop surface. As soon as this mutual contact between the positioning plates is created via the printing plate 5, an electric signal is triggered by which the positioning process in the horizontal direction is terminated. At the same time, the gripping device 10 receives a closing signal and holds the printing plate 5 in its defined position. Via a coupling 28, the gripping device 10 is connected with a rotary magnet 29. Upon the actuation of the coupling, the gripping device 10 is turned from its normal horizontal position into the vertical position. As soon as the printing plate 5 is held by the gripping device 10, the lifting cylinder 7 swings out of the transport path of the printing plate 5 and moves upwardly into its horizontal neutral position. The effective connection between the rotary magnet 29 and the gripping device 10 is neutralized by releasing the coupling, so that the gripping device 10 moves from the vertical to the horizontal position, whereby the printing plate 5 is still firmly held by the closed gripping device 10, which is illustrated in broken lines.

By means of a follow-up control device which, e.g., may be operated digitally, the gripping device 10 which still holds the printing plate 5 is moved to a suction table of the exposure and developing station 30. As soon as the gripping device 10 has reached its final position on this table, the printing plate 5 is drawn by suction onto the table. Now the gripping device 10 opens and returns to its original horizontal position. Then it again is turned up into its vertical position by the rotary magnet, via the coupling 28, and is ready to receive the next printing plate 5. The lifting cylinder 7 is swung back into its working position from its neutral position, i.e., the rod 25 is aligned vertically, so that the transport step for a new printing plate 5 can be initiated.

What is claimed is:

1. A device for transporting printing plates, having one coated and one uncoated surface, stacked in a holder to an exposure and developing station and for positioning them, comprising:
   a holder for holding a plurality of printing plates stacked in alternating relationship with a plurality of separating sheets, said holder including means for selectively positioning it substantially perpendicularly to the direction of transport of the printing plates so that the uncoated surface of each printing plate faces toward the direction of transport;
   a suction device for engaging the uncoated side of the first printing plate from the stack in said holder;
   means, movable horizontally in the direction of transport, for transporting said suction device between a first position adjacent said holder and a second position displaced from said first position in the direction of transport, to withdraw the engaged printing plate from the stack in said holder;
   a selectively engageable gripping device for the lower edge of the withdrawn printing plate, said gripping device being positioned beneath the second position of said transporting means;
   at least one nozzle positioned adjacent to said holder and pointing generally in the direction of transport for directing compressed air against the coated surface of the withdrawn printing plate; and
   means, positioned above said gripping device, for laterally positioning a printing plate located in the second position of said transporting means.

2. A device as claimed in claim 1, wherein said holder includes means for pivoting it into a horizontal position, so that the printing plates can be stacked in the holder with their coated surfaces facing downwardly.

3. A device as claimed in claim 1, further comprising two horizontally extending means for removing the first printing plate from the stack in said holder, said removing means pressing against the uncoated surface of the first printing plate when said holder is in its vertical position.

4. A device as claimed in claim 3, wherein each removing means comprises a plurality of rollers arranged on a common shaft and a motor for driving said shaft.

5. A device as claimed in claim 3 or claim 4, wherein one of said removing means contacts the stack of plates close to the upper edge of the stack and the other of said removing means contacts the stack of plates, close to the lower edge of the stack, and wherein the shafts of said removing means each rotate in opposite directions.

6. A device as claimed in claim 1, wherein said at least one nozzle is arranged above said holder with its opening being directed downwardly at an angle of between about 15° and 45° relative to the horizontal.

7. A device as claimed in claim 1, further comprising means for rotating said transporting means between said second position and a third position spaced vertically from the path of transport for the printing plates.

8. A device as claimed in claim 7, wherein said transporting means comprises a piston/cylinder device and said piston/cylinder device is fastened to one end of a pivotable rod and further includes a guide rod for horizontally fixing it in its working position, and wherein the suction device is arranged on the rod of the piston in said piston/cylinder device.

9. A device as claimed in claim 8, further comprising means for pivoting said pivotable rod, said piston/cylinder device and said guide rod from the horizontal position to the vertical position and vice-versa.

10. A device as claimed in claim 1, wherein each of said lateral positioning means comprises a positioning plate and a motor for moving said positioning plate, and wherein one of said positioning plates comprises a fixed stop surface for one edge of the printing plate which is capable of being brought into a stop position depending on the size of the printing plate, whereas the second positioning plate is capable of being moved in the direction of said stop surface until it strikes the edge of the printing plate, which lies opposite said stop surface.

11. A device as claimed in claim 1, wherein said gripping device further comprises means for rotating it between a vertical and a horizontal position, and means for advancing it in the direction of transport to an exposure station when the gripping device is in its horizontal position.

12. A device as claimed in claim 11, wherein the gripping device comprises a V-shaped feeding opening, a rotary magnet and a selectively engageable coupling member connecting said feeding opening with said rotary magnet.

* * * * *